(12) United States Patent
Buchet et al.

(10) Patent No.: US 11,398,765 B2
(45) Date of Patent: Jul. 26, 2022

(54) METHOD FOR CALIBRATING A MULTITURN SENSOR FOR DETERMINING THE POSITION OF A SPINDLE OF A CLUTCH ACTUATOR

(71) Applicant: Schaeffler Technologies AG & Co. KG, Herzogenaurach (DE)

(72) Inventors: Wai-Wai Buchet, Strassburg (FR); Markus Dietrich, Oberkirch (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 325 days.

(21) Appl. No.: 16/653,654

(22) Filed: Oct. 15, 2019

(65) Prior Publication Data
US 2020/0127537 A1 Apr. 23, 2020

(30) Foreign Application Priority Data
Oct. 23, 2018 (DE) .......................... 102018126372.4

(51) Int. Cl.
| | |
|---|---|
| *H02K 11/215* | (2016.01) |
| *H02K 7/06* | (2006.01) |
| *H02K 29/08* | (2006.01) |
| *G01D 5/12* | (2006.01) |
| *H01F 7/02* | (2006.01) |
| *G01R 35/00* | (2006.01) |
| *G01R 31/28* | (2006.01) |

(52) U.S. Cl.
CPC ............. *H02K 11/215* (2016.01); *G01D 5/12* (2013.01); *G01R 31/2829* (2013.01); *G01R 35/005* (2013.01); *H01F 7/02* (2013.01); *H02K 7/06* (2013.01); *H02K 29/08* (2013.01)

(58) Field of Classification Search
CPC ........ H02K 11/215; H02K 7/06; H02K 29/08; G01D 5/215

USPC ........................................ 310/68 B, 75 R, 98
See application file for complete search history.

(56) References Cited

U.S. PATENT DOCUMENTS

| | | | |
|---|---|---|---|
| 2003/0107837 A1* | 6/2003 | Jewett .................... | G11B 5/584 360/77.12 |
| 2018/0087549 A1* | 3/2018 | Modinger .............. | G01D 5/145 |
| 2019/0242448 A1* | 8/2019 | Ross ..................... | B60T 13/746 |

FOREIGN PATENT DOCUMENTS

DE        102016217856 A1      3/2018

* cited by examiner

*Primary Examiner* — Jose A Gonzalez Quinones
(74) *Attorney, Agent, or Firm* — Davidson, Davidson & Kappel, LLC

(57) ABSTRACT

A method is for calibrating a multiturn sensor for determining the position of a spindle of a clutch actuator, in which the multiturn sensor (5) is operatively connected to a magnetic field of a permanent magnet (12) in that the multiturn sensor (5) is combined with an actuator transmission (3) which comprises a spindle (9) bearing the permanent magnet (12). In a calibration method which can be carried out particularly quickly and cost-effectively, during the assembly of the multiturn sensor (5), arranged on a carrier element (4), with the actuator transmission (3) bearing the spindle (9), the multiturn sensor (5) is operated outside its specified rotational range (0, n), wherein a position, set by actuating the actuator transmission (3), of the spindle (9) bearing the permanent magnet (12) provided for an operating case of the clutch actuator (1), is assigned to a specified end position of the rotational range (0, n) of the multiturn sensor (5), as a result of which a magnetic field of the permanent magnet (12) is aligned with the multiturn sensor (5).

16 Claims, 1 Drawing Sheet

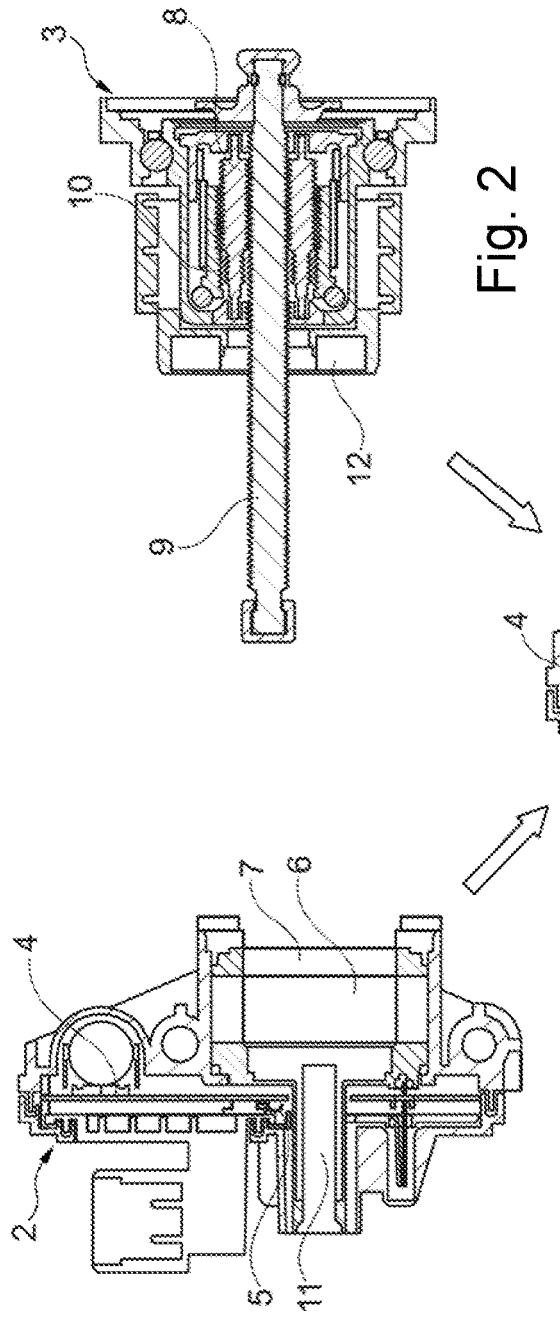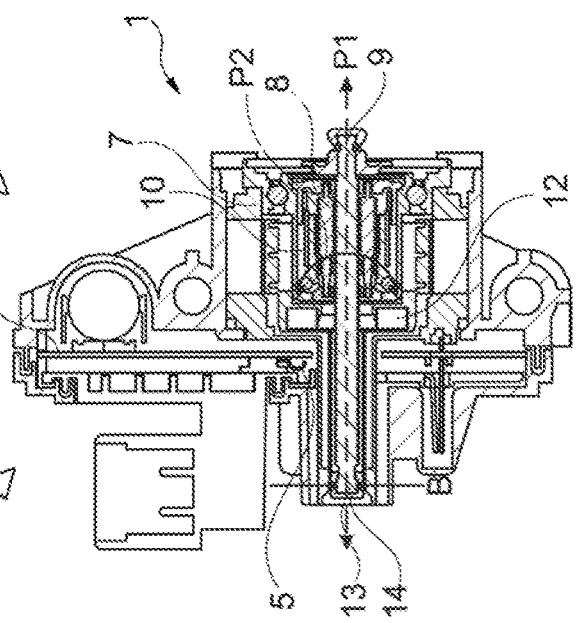

METHOD FOR CALIBRATING A MULTITURN SENSOR FOR DETERMINING THE POSITION OF A SPINDLE OF A CLUTCH ACTUATOR

The present disclosure relates to a method for calibrating a multiturn sensor for determining the position of a spindle of a clutch actuator, in which the multiturn sensor is operatively connected to a magnetic field of a permanent magnet in that the multiturn sensor is combined with an actuator transmission comprising a spindle bearing the permanent magnet.

BACKGROUND

DE 10 2016 217 856 A1 discloses a method for setting up a sensor system with a multiturn sensor. In this context, the sensor system is arranged on a circuit board and comprises a multiturn sensor which is arranged opposite a rotatable component. A permanent magnet which induces a magnetic field is attached to the component. In order to set a specified working range of the multiturn sensor for a specified magnetic field with respect to the component, in one fabrication step a reference magnet which represents the permanent magnet is arranged when the sensor system has not yet been arranged around the component. Between the multiturn sensor and the reference magnet, a geometric dependence is determined in accordance with the function of the multiturn sensor, wherein the specified working range is determined in accordance with the geometric relationship, and is set when the multiturn sensor and the component are assembled. Therefore, the multiturn sensor is initialized separately from the rotating component of an actuator transmission which bears the permanent magnet. Subsequently, the permanent magnet of the actuator transmission and the multiturn sensor are paired with one another. In the event of the pairing not being satisfactory, the actuator transmission has to be removed again and both components have to be newly initialized. Such a method is very costly since it requires a long clock time and high assembly costs.

SUMMARY

One object of the present disclosure is disclosing a method for calibrating a multiturn sensor for a clutch actuator, in which clock times and assembly costs are reduced.

According to the present disclosure this object is achieved in that during the assembly of the multiturn sensor, arranged on a carrier element, with the actuator transmission bearing the spindle, the multiturn sensor is operated outside its specified rotational range, wherein a position, set by actuating the actuator transmission, of the spindle bearing the permanent magnet provided for an operating case of the clutch actuator, is assigned to a specified end position of the rotational range of the multiturn sensor, as a result of which a magnetic field of the permanent magnet is aligned with the multiturn sensor. This has the advantage that it is possible to dispense with separate pre-initialization of the multiturn sensor and of the actuator transmission since during the assembly of the clutch actuator the permanent magnet is aligned in its angular position with respect to the multiturn sensor, and the multiturn sensor is therefore initialized. This reduces the costs for assembly. At the same time, it is possible to dispense with an external reference magnet, which further reduces the manufacturing costs. Subsequent tangential pressing of the permanent magnet, provided for the operating case, after the removal of the reference magnet on the spindle can be dispensed with.

The rotation of the multiturn sensor advantageously occurs outside its specified rotational range in the case of an unblocked movement of the spindle bearing the permanent magnet provided for the operating case. It is therefore possible for the calibration to be set easily between the multiturn sensor, in particular the specified rotational range thereof, with the magnetic field which is dependent on the angular position of the permanent magnet provided for the operating case.

In one refinement, the multiturn sensor is rotated within the rotational range until the specified end position is reached, wherein after the specified end position of the multiturn sensor is reached, the movement of the spindle bearing the permanent magnet is blocked, and the spindle is moved axially into the end position, representing a set position of the magnetic field of the permanent magnet, by rotating the actuator transmission. The axial movement of the spindle, which converts a rotational movement into a translatory movement through the action of the actuator transmission, causes the position of the permanent magnet arranged on the spindle to rotate, as a result of which the values of the magnetic field generated by the permanent magnet can be set with respect to the multiturn sensor.

In one variant, a first specified end position of the rotational range is brought about by rotating the multiturn sensor in a first direction and is assigned to a first end position of the spindle bearing the permanent magnet, while a second specified end position of the rotational range is brought about by rotating the multiturn sensor in a second direction opposing the first direction and is assigned to a second end position of the spindle bearing the permanent magnet. Therefore, values of the magnetic field generated by the permanent magnet can easily be associated with the specified end positions of the rotational range of the multiturn sensor.

In one embodiment, after the first end position of the rotational range of the multiturn sensor has been assigned to the first end position of the spindle and/or the second position of the rotational range of the multiturn sensor has been assigned to the second end position of the spindle, a rotation-preventing means on the spindle is secured. Such a rotation-preventing means ensures that the set relationship between the end positions of the rotational range of the multiturn sensor and the minimum position or maximum position of the magnetic field is ensured in a non-adjustable fashion in accordance with the specified end positions of the spindle over the operation of the clutch actuator. The attachment of the rotation-preventing means concludes the assembly of the clutch actuator.

In one particularly cost-effective refinement, a guide sleeve which is clamped on an end face of the spindle is used as a rotation-preventing means. Since this guide sleeve is already known as such, it is possible to dispense with an additional rotation-preventing means.

A multiturn sensor which stores in a currentless fashion is advantageously used as the multiturn sensor. This has the advantage that the rotational positions and the rotational range, once it has been defined, remains stored permanently in the multiturn sensor during the operation of the clutch actuator.

BRIEF SUMMARY OF THE DRAWINGS

The present disclosure permits numerous embodiments. One of these will be explained in more detail on the basis of the figures illustrated in the drawing, in which:

FIG. 1 illustrates an exemplary embodiment of a first component of a clutch actuator;

FIG. 2 illustrates an exemplary embodiment of a second component of the clutch actuator; and FIG. 3 illustrates an exemplary embodiment of the clutch actuator.

DETAILED DESCRIPTION

FIGS. 1 to 3 illustrate an exemplary embodiment of a device for carrying out the method according to the present disclosure, in which a clutch actuator 1 is illustrated. The clutch actuator 1 is composed from two components 2 and 3 in the fabrication process, wherein the component 2 has a control device which comprises a circuit board 4 on which a multiturn sensor 5 is positioned. In an axially extending cavity 6 in the component 2, a stator 7 of an electric motor is attached. An actuator transmission, which forms the component 3 of the clutch actuator 1, has a rolling-contact planetary transmission 8 which acts on an axially extending spindle 9. The rotor 10 of the electric motor is arranged around the rolling-contact planetary transmission 8. A permanent magnet 12 which is provided for the operating case of the clutch actuator 1 extends radially around the spindle 9 and is captively attached thereto.

If the multiturn sensor 5 is embodied, for example, as a GMA sensor (giant magneto-resistance sensor) which is based on the giant magneto-resistance effect, the latter is changed by a moving magnetic field. This magnetic field is predefined by the permanent magnet 12 which is attached to the spindle 9 and also follows the rotational movement thereof. The multiturn sensor includes a currentless storage. More specifically, the multiturn sensor includes a magnetic storage and the number of rotations which is measured by the multiturn sensor 5 is stored magnetically in the latter. A rotational movement can be sensed without an electrical voltage supply.

A method for calibrating a multiturn sensor 5 includes assembling the control device to the actuator transmission. Then, the electric motor is energized in a first rotational direction to move the spindle 9 in a first axial direction, e.g., left in the figures. At this point, the spindle 9 can rotate in the opening 11 so the sensor 5 is over-revved in the 0 position. Then, a fastener in the form of a guide sleeve 13 can be installed on the spindle 9 to lock the spindle 9 rotationally relative to the opening 11. The rotating the motor in the same direction can be continued (more over-revving in the 0 position) to move the spindle 9 all the way to the left (if it is not there already). Once the motor is energized in the other rotational direction, the spindle 9 moves to the right. The sensor 5 counts a number of rotations of the permanent magnet 12 to know an axial position of the spindle 9.

In a first method step, the components 2 and 3 are mechanically connected to one another in the component 2 of the clutch actuator 1, wherein the spindle 9 is introduced into an opening 11 in the component 2. After the clutch actuator 1 has been mounted in this way, in a second step the multiturn sensor 5 is calibrated. For this purpose, the multiturn sensor 5 is overrevved. Overrevving is to be understood in the section which follows as meaning that the multiturn sensor 5 is operated outside its specified rotational range. The multiturn sensor 5 can have here a rotational range between, for example, 0 and n rotations.

If the spindle 9 is not blocked rotationally, the spindle 9 can firstly move with the permanent magnet 12 in the direction of a first specified end position of the multiturn sensor 5. When said end position is reached, the spindle 9 is blocked (position B). If the multiturn sensor 5 is then overrevved in the direction of the first end position (rotation 0), the number of rotations stored in the multiturn sensor 5 remains at 0.

If the multiturn sensor 5 has reached the first end position of the multiturn sensor 5 (rotation 0), the rotation of the spindle 9 is blocked and the spindle 9 is moved axially in its zero position by rotating the actuator transmission 3 (arrow P1). This axial movement changes the angular position of the permanent magnet 12 which is attached to the spindle 9 (arrow P2), and therefore that of the magnetic field, generated by the permanent magnet 12, with respect to the multiturn sensor 5. A first end position of the spindle 9 and therefore a fixed angular position of the magnetic field of the permanent magnet 12 are therefore assigned to the first position (rotation 0).

As soon as the multiturn sensor 5 rotates in the opposite direction when the spindle 9 is unblocked, the multiturn sensor 5 begins to count the rotations until said multiturn sensor 5 has reached the second specified end position (rotation n) of the multiturn sensor 5. The spindle 9 is then blocked again (position B). If the multiturn sensor 5 is overrevved after the second end position has been reached, the spindle 9 is moved axially into its n position by rotating the actuator transmission 3 (arrow P1). The rotational speed of the multiturn sensor 5 remains at n. However, if rotation occurs in the opposite direction, the multiturn sensor 5 begins to count down the rotations starting from n. Therefore, the second end position (rotation n) of the multiturn sensor 5 is assigned to the second end position of the spindle 9 and therefore to a fixed second angular position of the magnetic field of the permanent magnet 12.

After this calibration has ended, a fastener in the form of a guide sleeve 13 is installed on an end face 14 of the spindle 9, so that once the relationships have been specified between the rotational range (0, n) of the multiturn sensor 5 and the end positions of the spindle 9 during the operation of the clutch actuator 1 they remain unchanged.

By means of the described solution it is possible that when the clutch actuator is put into operation the position of spindle 9 is directly known, since precise assignment of the magnetic field of the permanent magnet 12 is ensured by means of the end positions of the spindle 12 with respect to the multiturn sensor 5.

LIST OF REFERENCE NUMBERS

1 Clutch actuator
2 Component of the clutch actuator
3 Component of the clutch actuator
4 Circuit board
5 Multiturn sensor
6 Cavity
7 Stator
8 Rolling-contact planetary transmission
9 Spindle
10 Rotor
11 Opening
12 Permanent magnet
13 Guide sleeve
14 End face of the spindle

What is claimed is:

1. A method for calibrating a multiturn sensor for determining the position of a spindle of a clutch actuator, in which the multiturn sensor is operatively connected to a magnetic field of a permanent magnet in that the multiturn sensor is combined with an actuator transmission which comprises a spindle bearing the permanent magnet, the method comprising:

during the assembly of the multiturn sensor, arranged on a carrier element, with the actuator transmission bearing the spindle, operating the multiturn sensor outside a specified rotational range of the multiturn sensor; and assigning a position, set by actuating the actuator transmission, of the spindle bearing the permanent magnet provided for an operating case of the clutch actuator, to a specified end position of the specified rotational range of the multiturn sensor, as a result of which a magnetic field of the permanent magnet is aligned with the multiturn sensor.

2. The method as claimed in claim 1, wherein the rotation of the multiturn sensor occurs outside the specified rotational range of the multiturn sensor in an unblocked movement of the spindle bearing the permanent magnet.

3. The method as claimed in claim 1, wherein the multiturn sensor is rotated within the specified rotational range until the specified end position is reached, wherein after the specified end position of the multiturn sensor is reached, the movement of the spindle bearing the permanent magnet is blocked, and the spindle is moved axially into an end position, representing a set position of the magnetic field of the permanent magnet, by rotating the actuator transmission.

4. The method as claimed in claim 1, wherein a first specified end position of the specified rotational range is brought about by rotating the multiturn sensor in a first direction and is assigned to a first end position of the spindle bearing the permanent magnet, while a second specified end position of the specified rotational range is brought about by rotating the multiturn sensor in a second direction opposing the first direction and is assigned to a second end position of the spindle bearing the permanent magnet.

5. The method as claimed in claim 4, wherein after the first specified end position of the specified rotational range of the multiturn sensor has been assigned to the first end position of the spindle and/or the second specified end position of the specified rotational range of the multiturn sensor has been assigned to the second end position of the spindle, a fastener on the spindle is secured to prevent rotation of the spindle.

6. The method as claimed in claim 5, wherein the fastener is a guide sleeve clamped on an end face of the spindle.

7. The method as claimed in claim 1, wherein the multiturn sensor includes a currentless storage.

8. The method as claimed in claim 7, wherein the currentless storage is a magnetic storage.

9. A method for calibrating a multiturn sensor comprising:
mechanically connecting a first component and a second component of a clutch actuator together, the first component including the multiturn sensor, the second component including a spindle, an actuator transmission and a permanent magnet; and
moving the spindle axially in a first direction to a first end position of the spindle such that the multiturn sensor is operated outside a specified rotational range of the multiturn sensor while maintaining a recording, by the multiturn sensor, of a specified first end position of the multiturn sensor.

10. The method as recited in claim 9 wherein the moving of the spindle axially in the first direction includes rotating the permanent magnet about an axis of the spindle in a first rotational direction into a first fixed angular position of a magnetic field of the permanent magnet and assigning the first fixed angular position of the magnetic field of the permanent magnet to the recorded specified first end position of the multiturn sensor.

11. The method as recited in claim 9 further comprising moving the spindle axially in a second direction to a second end position of the spindle such that the multiturn sensor is operated outside the specified rotational range of the multiturn sensor while maintaining a recording, by the multiturn sensor, of a specified second end position of the multiturn sensor.

12. The method as recited in claim 11 wherein the moving of the spindle axially in the first direction includes rotating the permanent magnet about an axis of the spindle in a first rotational direction into a first fixed angular position of a magnetic field of the permanent magnet and assigning the first fixed angular position of the magnetic field of the permanent magnet to the recorded specified first end position of the multiturn sensor, wherein the moving of the spindle axially in the second direction includes rotating the permanent magnet about the axis of the spindle in a second rotational direction into a second fixed angular position of the magnetic field of the permanent magnet and assigning the second fixed angular position of the magnetic field of the permanent magnet to the recorded specified second end position of the multiturn sensor.

13. The method as recited in claim 11 further comprising installing a fastener onto the spindle to maintain the first and second specified end positions of the multiturn sensor with respect to the first and second end positions of the spindle.

14. The method as recited in 9 wherein the recording, by the multiturn sensor, of the specified first end position of the multiturn sensor includes currentlessly storing the specified first end position of the multiturn sensor.

15. The method as recited in 14 wherein the currentlessly storing the specified first end position of the multiturn sensor includes magnetically storing the specified first end position of the multiturn sensor.

16. A method for calibrating a multiturn sensor comprising:
mechanically connecting a first component and a second component of a clutch actuator together, the first component including the multiturn sensor, the second component including a spindle, an actuator transmission and a permanent magnet;
energizing the permanent magnet in a first rotational direction to move the spindle in a first axial direction into an opening so the multiturn sensor is overrevved past a first specified end position;
installing a fastener on the spindle to lock the spindle rotationally relative to the opening;
energizing the permanent magnet in a second rotational direction to move the spindle in a second axial direction; and
counting, via the multiturn sensor, a number of rotations of the permanent magnet past the first specified end position to know an axial position of the spindle.

\* \* \* \* \*